(12) United States Patent
Bachtold et al.

(10) Patent No.: US 7,211,853 B2
(45) Date of Patent: May 1, 2007

(54) ELECTRONIC DEVICE USING CARBON NANOTUBES

(75) Inventors: Adrian Bachtold, Delft (NL); Cees Dekker, Delft (NL)

(73) Assignee: Technische Universiteit Delft, BL Delft (NL)

( * ) Notice: Subject to any disclaimer, the term of this patent is extended or adjusted under 35 U.S.C. 154(b) by 264 days.

(21) Appl. No.: 10/762,625

(22) Filed: Jan. 22, 2004

(65) Prior Publication Data

US 2004/0169241 A1 Sep. 2, 2004

Related U.S. Application Data

(63) Continuation-in-part of application No. PCT/NL01/00577, filed on Jul. 26, 2001.

(51) Int. Cl.
*H01L 27/108* (2006.01)

(52) U.S. Cl. ........................................ 257/296; 977/762

(58) Field of Classification Search ................ 257/296; 977/762

See application file for complete search history.

(56) References Cited

U.S. PATENT DOCUMENTS 6,648,711 B1 * 11/2003 Yoo et al. ....................... 445/51
2004/0144972 A1 * 7/2004 Dai et al. ....................... 257/20

FOREIGN PATENT DOCUMENTS

DE 4401442 C1 3/1995
WO WO00/51186 A 8/2000

OTHER PUBLICATIONS

S.J. Wind. Carbon Nanotube Devices for Future Nenoelectronics. Aug. 2003, pp. 236-239.*
Nihey et al., A Top-Gate Carbon-Nanotube Field-Effect Transistor with a Titanium-Dioxide Insulator. Jul. 15, 2002. The Japan Society of Applied Physics, vol. 41 (2202) pp. L 1049-L 1051.*
McEuen, P.L., "Carbon-Based Electronics," *Nature*, vol. 393, pp. 15-16 (1998).
Martel, R., "Single—and Multi-Wall Carbon Nanotube Field-Effect Transistors," *Applied Physics Ltrs*, vol. 73, No. 17, pp. 2447-2449 (Oct. 26, 1998).
Rueckes, T., et al., "Carbon Nanotube-Based Nonvolatile Random Access Memory for Molecular Computing," *Science*, vol. 289, pp. 94-97 (Jul. 7, 2000).
Yamada, T., "Analysis of Submicron Carbon Nanotube Field-Effect Transistors," *Applied Physics Ltrs.*, vol. 76, No. 5, pp. 628-630 (Jan. 31, 2000).

* cited by examiner

*Primary Examiner*—Douglas W. Owens
(74) *Attorney, Agent, or Firm*—Jeffrey D. Myers; Peacock Myers, P.C.

(57) ABSTRACT

An electronic device incorporating a tubular shaped carbon molecule supported by a substrate, which molecule is provided with source and drain electrodes, as well as a gate electrode, wherein the gate electrode is a metallic electrode. The metallic electrode has a surface layer of oxide, preferably native oxide. The metallic electrode is preferably aluminium, zinc and copper.

5 Claims, 3 Drawing Sheets

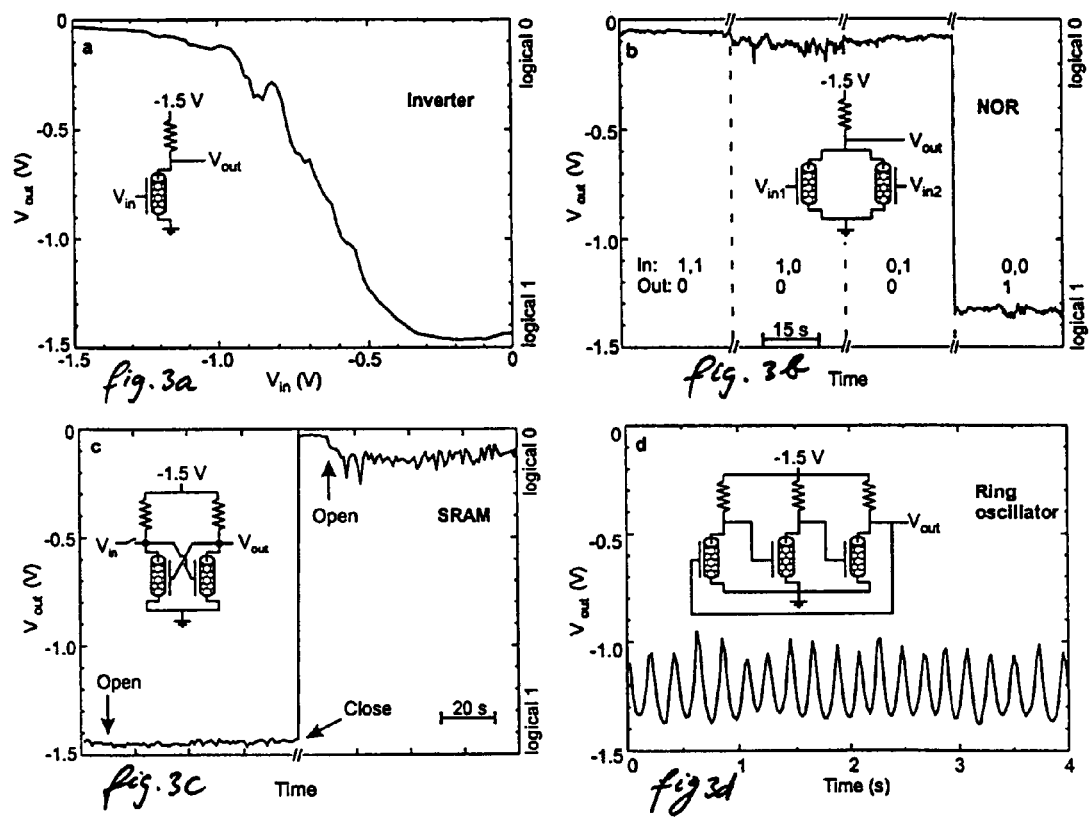

ELECTRONIC DEVICE USING CARBON NANOTUBES

The invention relates to an electronic device incorporating a tubular shaped carbonmolecule supported by a substrate, which molecule is provided with source and drain electrodes, and a gate electrode.

Such an electronic device is known from Nature, Volume 393, May 7, 1998, pages 15 to 17. From this publication a transistor is known having a so called semi-conducting carbon nanotube of about 1 nanometer in diameter that bridges source and drain electrodes. A gating voltage is applied to the silicon substrate that supports the carbon nanotube in order to induce carriers onto the nanotube to control the transistor.

When more than one or even many nanotube electronics are to be implemented on a silicon substrate the challenge then is to be able to control the respective transistors individually. It is therefore a prime objective of the invention to provide an electronic device according to the preamble of the main claim that is capable of being controlled individually.

A further objective is to provide such an electronic device having a gain of substantially more than one.

The electronic device according to the invention is therefore characterised in that the gate electrode is a metallic electrode. The metallic electrode in turn is preferably supported by the substrate.

Preferably the metallic electrode has a surface layer of oxide thus preventing short circuiting the source and drain electrodes. Native oxide provides an effective insulation layer with respect to both the carbon molecule per se and the respective source and drain electrodes. The oxide layer can also be grown for instance by evaporation, but should remain thin.

Particularly good results can be achieved when the metallic electrode is selected from the group consisting of aluminium, zinc and copper. Preferably however the metallic electrode is an aluminium electrod.

The invention will now be further elucidated with reference to the drawing.

In the drawing:

FIG. 3 shows several electronic devices according to the invention incorporating 1, 2 or 3 transistors.

Figure 1:
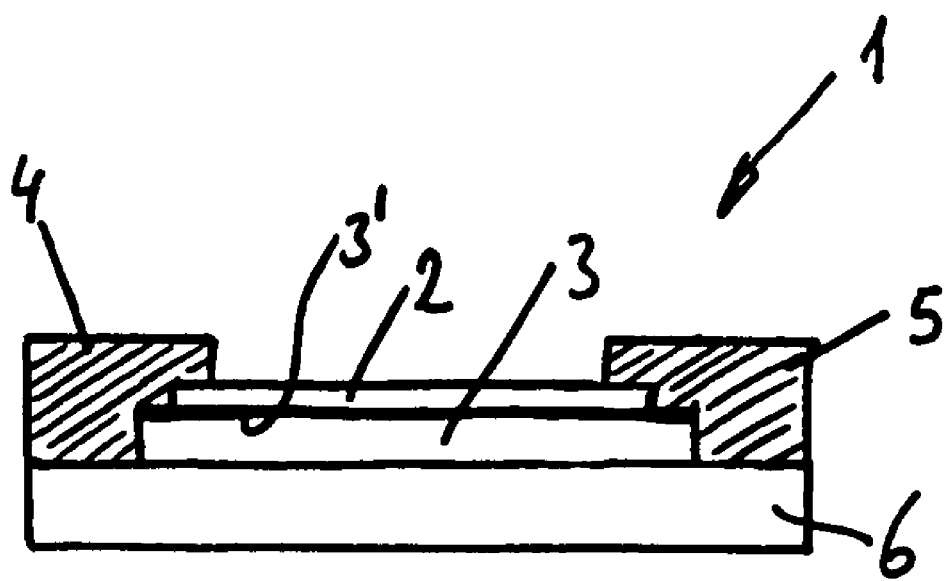
FIG. 1 shows a side view at the lay-out of an electronic device according to the invention.

Referring now first to FIG. 1, a schematic device lay-out of an electronic device according to the invention is shown. The device 1 incorporates a tubular shaped carbon molecule 2 which is supported by an aluminium wire 3 which, at the side facing the tubular carbon molecule 2, is provided with an insulating native $Al_2O_3$ layer 3'. On both its extremities the tubular carbon molecule 2 is contacted by gold contacts 4 and 5 which are acting as the source and drain electrodes respectively. The thickness of the $Al_2O_3$ layer 3' on the surface of the aluminium electrode 3 is in the order of magnitude of a few nanometers and much shorter than the separation between the contact electrodes 4 and 5 which is approximately 100 nanometer. This provides an excellent capacitive coupling between the gate electrode 3 and the tubular carbon molecule. This construction of the electronic device according to the invention allows for the integration of multiple similar devices acting as (nanotube) field effect transistors on the same substrate 6 whereby each transistor is individually controllable.

Figure 2A:
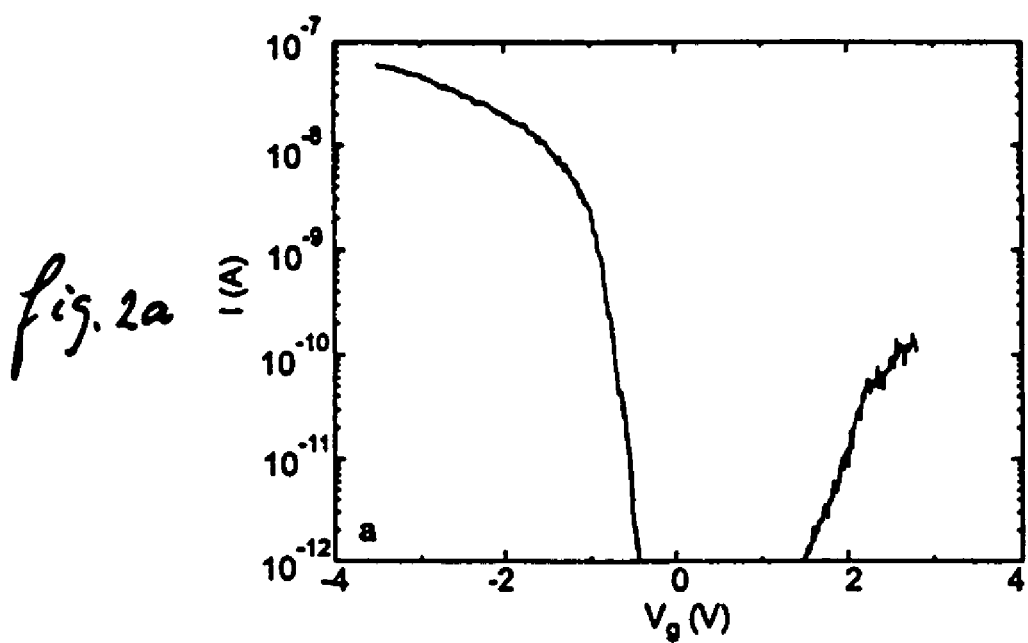
FIG. 2 shows I–V characteristics of a single nanotube transistor according to the invention.

FIG. 2 shows the device characteristics of a typical nanotube FET. The variation of the current I through the device as a function of the gate voltage $V_g$ (FIG. 2a) shows that very significant doping can be achieved. Starting with negative $V_g$, the current first decreases, then becomes immeasurably small, and finally increases again. This indicates that $V_g$ shifts the Fermi level successively from the valence band (accumulation regime) to the gap (depletion) and finally to the conduction band (inversion) of the semi conducting nanotube. The nearby Al gate thus makes it possible to change the doping of the nanotube over the full range from p-doping to n-doping. Several volts can be applied on the gate without destroying the oxide layer. This is quite remarkable since the insulator layer is only a few nanometers thin, and it indicates the excellent quality of the gate oxide. The break-down threshold voltage where the layer is destroyed is typically between 2 and 5 V. A small gate leakage current (a few pA) is observed for $V_g$ approaching such large gate voltages.

Figure 2B:
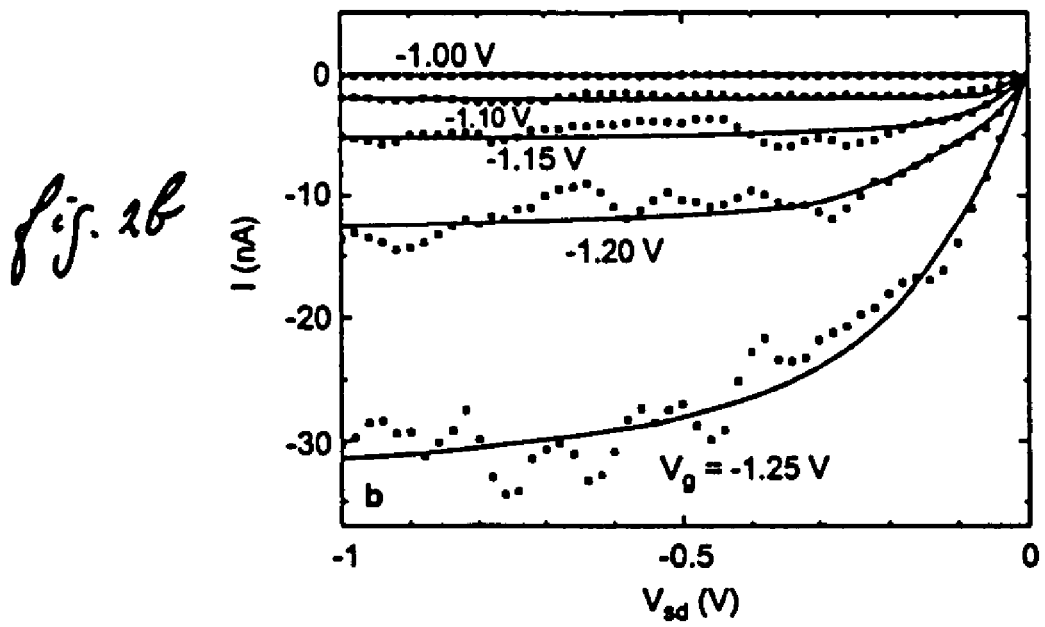

FIG. 2b shows the current versus bias voltage characteristics. Typical FET-type curves are found. For small source-drain voltages, the current changes rapidly then when the source-drain voltage $V_{sd}$ is made more negative. This is called the linear regime because the current is proportional to $V_{sd}$. When $V_{sd}$ becomes more negative than $V_g - V_t$, the current through the transistor changes more gradually (the saturation regime). Here $V_t$ is called the threshold voltage at which (some) current starts to flow. It has a value of about −1.0 V for the transistor to which FIG. 2b relates. For a constant source-drain voltage in the saturation regime, the current has a parabolic dependence on the gate voltage $I \sim (V_g - V_t)^2$. This data shows that the transconductance of the nanotube transistors is 0.4 µSiemens and the on/off ratio is at least $10^5$. The maximum current that the nanotube transistor could tolerate was in the order of 100 nA and the on resistance was about $R_{sd}$=33 MΩ for $V_{sd}$=−1.0 V, $V_g$=−1.3 V. Note that it is clear from FIG. 2a that even lower resistances can be achieved upon using higher gate voltages (80 kΩ for $V_g$=−3 V). A voltage gain of at least 10 can be achieved.

FIG. 3a shows the input-output characteristics of an inverter constructed from a nanotube transistor and an off-chip 100 MΩ bias resistor. An inverter is a basic logic element that converts a logical 0 into a logical 1, and a logical 1 into a logical 0. When the input is a logical 1 ($V_{in}$=0 V), then the nanotube is non conducting and the output is pulled to −1.5V, representing a logical 1.

The output voltage of an inverter should make a rapid transition from one logic level to the other as the gate voltage is swept. In this device according to the invention, the output voltage changes three times faster than the input voltage in the transition region indicating that this particular device has a voltage gain of 3 (other devices showed a gain of up to 6).

A NOR gate can be constructed by simply replacing the single transistor in the inverter with two transistors in parallel as shown in FIG. 3b. When either or both of the inputs are a logical 1 ($V_{in}$=−1.5 V), at least one of the nanotubes is conducting and the output is pulled to 0 V (logical 0). The output is a logical 1 only when both inputs are a logical 0 so that neither nanotube is conducting.

In FIG. 3b, the output voltage is plotted as a function of the four possible input states (0,0), (0,1), (1,0) and (1,1), verifying that this circuit indeed operates as a NOR gate. Using variations of the device circuitry one can realise any logical gate in this way.

A flip-flop memory element (SRAM) was constructed from two inverters, see FIG. 3c. When the output of each inverter is connected to the input of the other inverter, two different stable states are possible: The outputs can either take on the values (1,0) or (0,1). A logical 1 is written into memory by forcing the circuit into the (0,1) state and a logical 0 is written by forcing the circuit into the (1,0) state. To test the working of the memory cell, a voltage source was attached to one input and a logical 0 was written to $V_{out}$ by driving $V_{in}$ to −1.5 V. The switch was then opened again and the memory cell maintained a logical 1 at the output. These data thus demonstrate the stable memory function of a 2-transistor nanotube circuit according to the invention.

A 3-transistor device was realised in the ring oscillator shown in FIG. 3d. This circuit, used to generate an oscillating ac voltage signal, was built by connecting three inverters in a ring. A ring oscillator has no statically stable solution and the voltage at the output of each inverter consequently oscillates as a function of time. One of the inverter outputs is plotted in FIG. 3d. A clear voltage oscillation is observed. The 5 Hz frequency of the oscillations is determined by the output impedance of the inverters (~1 GΩ) and the capacitance of the output nodes which currently is dominated by the ~100 pF parasitic capacitance of the wires connecting to the off-chip bias resistors.

A method to manufacture an electronic device according to the invention is explained below.

Al gates 3 for multiple nanotube transistors are first patterned using electron beam lithography on an oxidised Si wafer 6. During evaporation, the sample was cooled to liquid nitrogen temperature in order to minimise the roughness of the Al surface 3. The insulator layer 3' consists of the native oxide that grows by exposing the Al surface 3 to air. The precise thickness of this layer is in the order of a few nanometers. Carbon nanotubes 2 produced by laser ablation are dispersed on the wafer 6 from a dispersion in dichloroethane. Using an atomic force microscopy, those nanotubes 2 are selected that have a diameter of about 1 nm and that are situated on top of the Al gate wires 3. Their co-ordinates are registered with respect to alignment markers. Finally, contact electrodes 4,5 are fabricated with electron-beam lithography by evaporating Au directly on the nanotube 2 without adhesion layer.

What is claimed is:

1. An electronic device comprising a tubular shaped carbon molecule supported by a substrate, which molecule is provided with source and drain electrodes directly contacting said carbon molecule, as well as a gate electrode, wherein the gate electrode is a metallic electrode.

2. The electronic device according to claim 1, wherein the metallic electrode has a surface layer of oxide.

3. The electronic device according to claim 2, wherein the surface layer of oxide comprises a native oxide.

4. The electronic device according to claim 1, wherein the metallic electrode is selected from the group consisting of aluminum, zinc and copper.

5. The electronic device according to claim 4, wherein the metallic electrode is an aluminum electrode.

* * * * *